United States Patent
Lee et al.

(10) Patent No.: US 6,455,374 B1
(45) Date of Patent: Sep. 24, 2002

(54) METHOD OF MANUFACTURING FLASH MEMORY DEVICE

(75) Inventors: Keun Woo Lee; Bong Kil Kim, both of Kyungki-Do; Ki Jun Kim, Seoul; Keon Soo Shim, Kyungki-Do, all of (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 10/026,957

(22) Filed: Dec. 27, 2001

(30) Foreign Application Priority Data

Nov. 23, 2001 (KR) ............................................. 01-73420

(51) Int. Cl.[7] ............................................. H01L 21/336
(52) U.S. Cl. ........................ 438/257; 438/260; 438/262; 257/315
(58) Field of Search ................................ 438/201, 211, 438/257, 260, 262, 266; 257/314, 315, 316, 20, 30

(56) References Cited

U.S. PATENT DOCUMENTS 6,005,270 A * 12/1999 Noguchi et al. ............ 257/315

* cited by examiner

*Primary Examiner*—Hoai Ho
*Assistant Examiner*—Dung Anh Le
(74) *Attorney, Agent, or Firm*—Morgan, Lewis & Bockius LLP

(57) ABSTRACT

The present invention relates to a method of manufacturing a flash memory device. According to the present invention, a dielectric film is formed and an amorphous silicon layer is then formed to mitigate a topology generated by patterning of a first polysilicon layer in a cell region. The amorphous silicon layer serves as a protection layer of the dielectric film in the cell region when a gate oxide film in a peripheral circuit region is formed. Therefore, the present invention can not only improve the resistance of a word line in the cell region but also improve the film quality of the dielectric film and the gate oxide film in the peripheral circuit region.

9 Claims, 4 Drawing Sheets

METHOD OF MANUFACTURING FLASH MEMORY DEVICE

BACKGROUND OF THE INVENTION

1. Field of the Invention

The invention relates generally to a method of manufacturing a flash memory device, and more particularly to, a method of manufacturing a flash memory device capable of improving not only the resistance of a word line but also the film quality of a dielectric film and a gate oxide film in a peripheral circuit region.

2. Description of the Prior Art

Generally, a flash memory device is mainly divided into a cell region and a peripheral circuit region. The peripheral circuit region is divided into a high voltage transistor region and a low voltage transistor region.

As the integration level of semiconductor devices becomes higher, reduction of the device is inevitably required as the area occupied by a unit device is reduced. Due to this, there are problems that the resistance in the wire such as a word line is increased and the device is higher integrated. In order to improve the performance of the device even though the device is reduced, it is required that the film quality of a dielectric film of an ONO (Oxide-Nitride-Oxide) structure, an insulating film applied to other devices, and the like be preferably formed. In particular, in a cell gate of a stack gate flash EEPROM, it is a general practice that metal-silicide such as tungsten-silicide ($WSi_x$) has been used in order to reduce the resistance of the word line.

FIG. 1A~FIG. 1D are cross-sectional views of a conventional flash memory device for explaining a method of manufacturing the device.

Referring now to FIG. 1A, a device isolation film 12 is formed in a semiconductor substrate 11 in which the cell region and the peripheral circuit region (including the high voltage transistor region and the low voltage transistor region) are defined. Then, a tunnel oxide film 13 and a first polysilicon layer 14 are sequentially formed on the entire surface of the semiconductor substrate 11 in which the device isolation film 12 is formed. Next, the first polysilicon layer 14 and the tunnel oxide film 13 are removed by an etch process using a first photoresist pattern (not shown) through which the device isolation film 12 in the cell region is exposed and the first photoresist pattern is then removed.

In the above, the tunnel oxide film 13 is formed in thickness of 80 Å±4 Å and the first polysilicon layer 14 is formed in thickness 600 Å±60 Å.

Referring now to FIG. 1B, a dielectric film 15 is formed on the entire structure including the first patterned polysilicon layer 14. The dielectric film 15 and the first polysilicon layer 14 in the peripheral circuit region are removed by an etch process using a second photoresist pattern (not shown) in which the cell region is covered. Then, the second photoresist pattern is removed.

In the above, the dielectric film 15 has an ONO structure in which a lower oxide film is deposited in thickness of 40 Å±4 Å, a nitride film is deposited in thickness of 60 Å±6 Å and an upper oxide film is deposited in thickness of 40 Å±4 Å.

Referring to FIG. 1C, a process of oxidizing a gate in the high voltage transistor, a process of forming a third photoresist pattern (not shown) through which the low voltage transistor region is exposed, a wet etch process of removing oxide, a process of removing the third photoresist pattern and process of oxidizing the gate in the low voltage transistor are sequentially implemented to form gate oxide films 16a and 16b in the high voltage transistor region and the low voltage transistor region, respectively. A second polysilicon layer 17 is formed on the entire structure in which the gate oxide films 16a and 16b are formed.

In the above, the high voltage gate oxide film 16a is formed in thickness of 125 Å±6 Å and the low voltage gate oxide film 16b is formed in thickness of 55 Å±3 Å. The second polysilicon layer 17 is formed in thickness of 700 Å±70 Å wherein the second polysilicon layer 17 is formed by first depositing doped polysilicon in thickness of about 600 Å and then depositing undoped polysilicon in thickness of about 100 Å.

Referring now to FIG. 1D, a metal-silicide layer 18 is formed on the second polysilicon layer 17 and a hard mask layer 19 is formed on the metal-silicide layer 18. Next, general processes are performed In the above, the metal-silicide layer 18 is formed by depositing a material such as tungsten silicide in thickness of 1500 Å±150 Å. The hard mask layer 19 functions to protect the gate from processes such as an etch process, etc. that is subsequently performed and is formed by sequentially depositing a PE-TEOS film, a PE-the nitride film and an ARC nitride film. At this time, the PE-TEOS film is deposited in thickness of 300 Å±30 Å, the PE-the nitride film is deposited in thickness of 2000 Å±200 Å and the ARC nitride film is deposited in thickness of 1200 Å±120 Å.

The flash memory device explained by reference to the drawings was described by taking a stack gate flash EEPROM of 0.18 $\mu$m technology as an example. Therefore, it should be noted that the numerical limit is set based on 0.18 $\mu$m technology.

If the flash memory device is manufactured by the above conventional method, there occur the following problems.

First, as, only the device isolation film 12 portion in the cell region in the first polysilicon layer 14 etched using the first photoresist pattern as an etch mask is open, the difference in a topology is generated in this portion. Thus, a seam 100 is generated in the metal-silicide layer 18 that will become the word line along with the second polysilicon layer 17, as shown in FIG. 1d. The seam 100 is further expanded through a subsequent annealing process and the resistance of the word line is thus significantly increased. An increase in the resistance of the word line causes to reduce the speed of the device. In general, an EDR target (Electrical Design Rule Target) has a sheet resistance in the word line of 7.6Ω. On the contrary, the sheet resistance in the word line where the seem 100 is generated as above is over 45Ω.

Second, after the dielectric film 15 such as the ONO structure is formed, the dielectric film 15 and the first polysilicon layer 14 in the peripheral circuit region are removed by an etch process using the second photoresist pattern and the second photoresist pattern is then removed. At this time, when the second photoresist pattern is removed, loss of about 5 Å is generated on the surface of the dielectric film 15 and the film quality of the dielectric film 15 is transformed by plasma that is applied when the second photoresist pattern is removed. Therefore, the quality of the dielectric film 15 as an insulating material is degraded and the capability to store information that is most important in the flash memory device is resultantly degraded.

Third, when the gate oxide films 16a and 16b are formed in the peripheral circuit region, a pre-cleaning process is performed in order to improve the film quality of the gate oxide films 16a and 16b. In this case, there is a problem that loss of the dielectric film 15 such as the ONO structure is caused to degrade the film quality of the dielectric film 15. Meanwhile, if the pre-cleaning process is not performed in order to prevent degradation in the film quality of the dielectric film 15, there is a problem that the film quality of the gate oxide films 16a and 16b is degraded.

SUMMARY OF THE INVENTION

The present invention is contrived to solve the above problems and an object of the present invention is to provide a method of manufacturing a flash memory device capable of improving not only the resistance of a word line but also the film quality of a dielectric film and a gate oxide film in a peripheral circuit region.

In order to accomplish the above object, a method of manufacturing a flash memory device according to the present invention, is characterized in that it comprises the steps of forming a device isolation film in a semiconductor substrate in which a cell region and a peripheral circuit region are defined; sequentially forming a tunnel oxide film and a first polysilicon layer on the entire surface of the semiconductor substrate; removing the first polysilicon layer and the tunnel oxide film to expose the device isolation film in the cell region; forming a dielectric film on the entire surface including the first polysilicon layer; forming an amorphous silicon layer on the entire surface including the dielectric film; etching the amorphous silicon layer to an extent that the dielectric film is not exposed; removing the amorphous silicon layer, the dielectric film and the first polysilicon layer in the peripheral circuit region; forming a gate oxide film in the peripheral circuit region; forming a second polysilicon layer on the entire structure including the gate oxide film; removing the second polysilicon layer in the cell region to expose the amorphous silicon layer in the cell region and the second polysilicon layer in the peripheral circuit region; forming a top polysilicon layer on the entire structure including the exposed amorphous silicon layer and the second exposed polysilicon layer; and forming a metal-silicide layer on the top polysilicon layer.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1A:
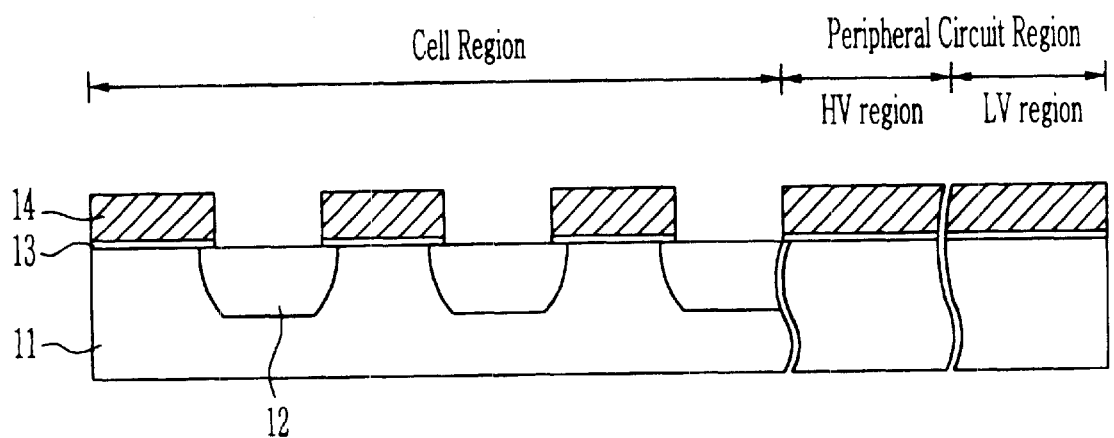
FIG. 1A~FIG. 1D are cross-sectional views of a conventional flash memory device for explaining a method of manufacturing the device.
Figure 1B:
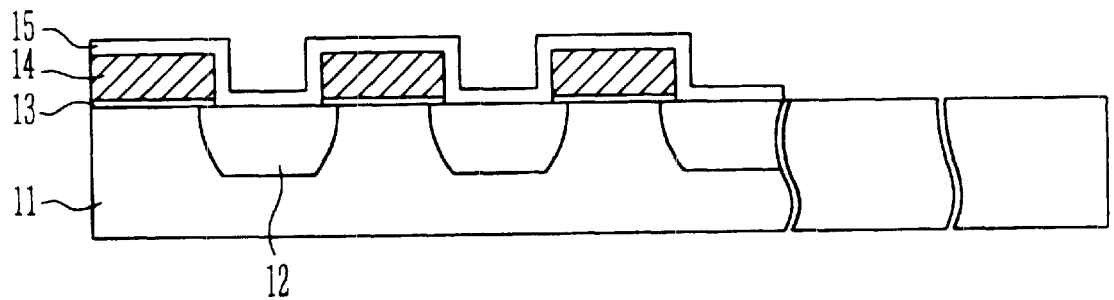
Figure 1C:
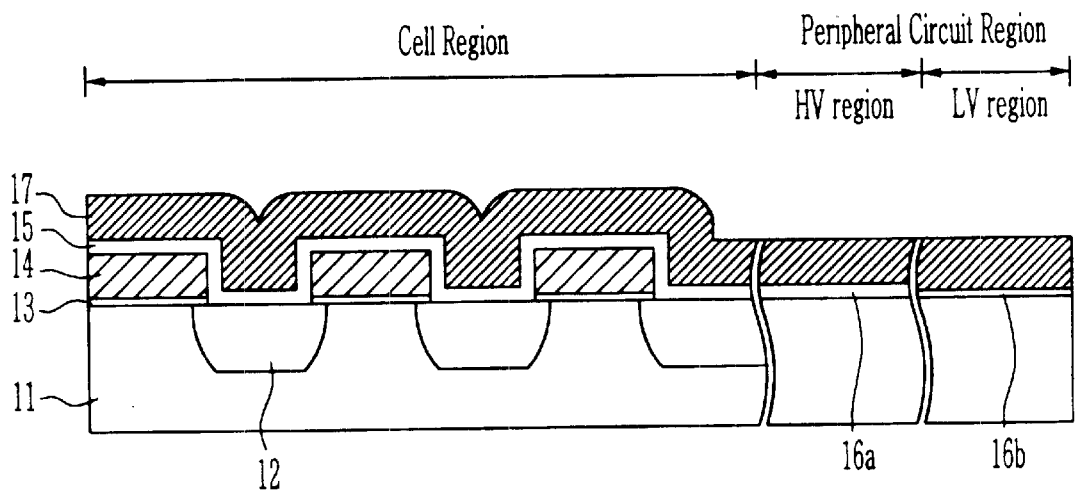
Figure 1D:
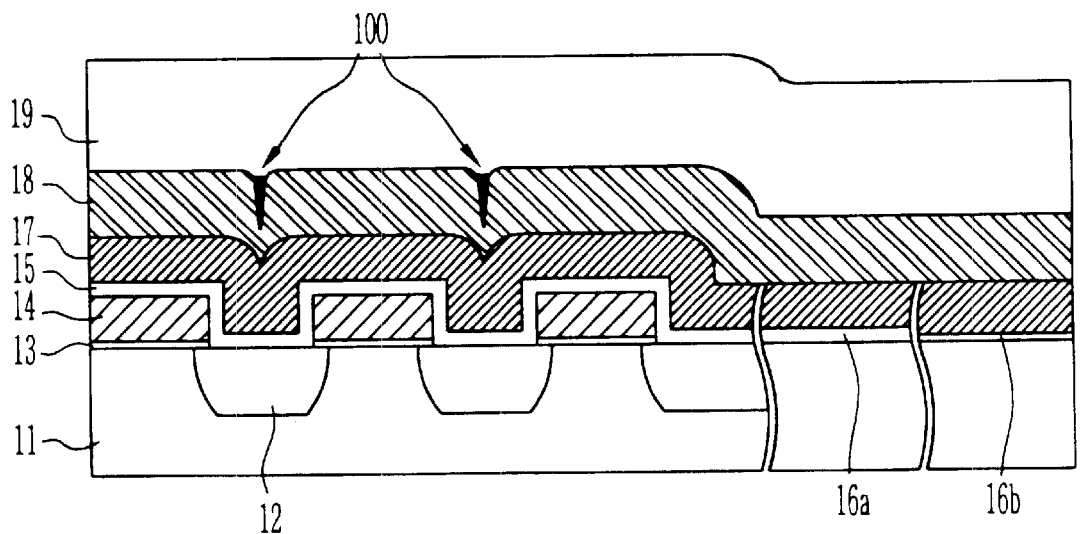

The present invention will be described in detail by way of a preferred embodiment with reference to accompanying drawings, in which like reference numerals are used to identify the same or similar parts.

FIG. 2A~FIG. 2F are cross-sectional views of a flash memory device for explaining a method of manufacturing the device according to one embodiment of the present invention.

Figure 2A:
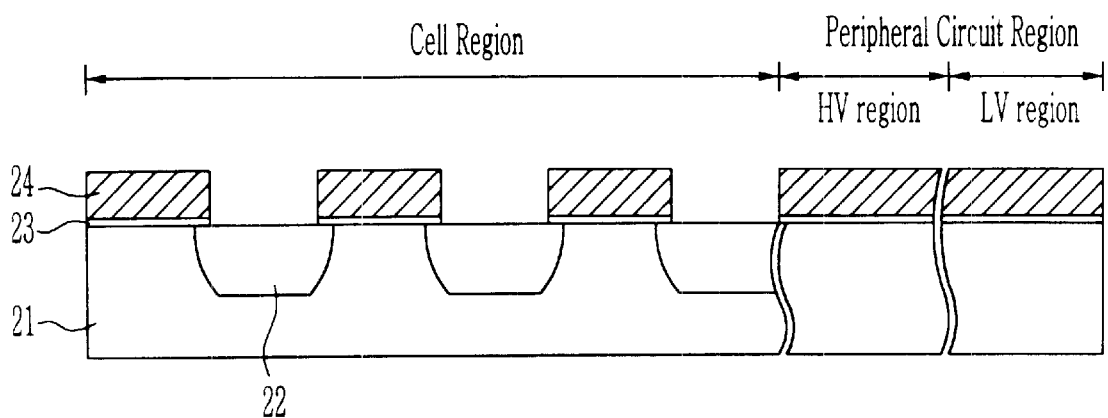
FIG. 2A~FIG. 2F are cross-sectional views of a flash memory device for explaining a method of manufacturing the device according to one embodiment of the present invention.

Referring now to FIG. 2A, a device isolation film 22 is formed in a semiconductor substrate 21 in which the cell region and the peripheral circuit region (including the high voltage transistor region and the low voltage transistor region) are defined. Then, a tunnel oxide film 23 and a first polysilicon layer 24 are sequentially formed on the entire surface of the semiconductor substrate 21 in which the device isolation film 22 is formed. Next, the first polysilicon layer 24 and the tunnel oxide film 23 are removed by an etch process using a first photoresist pattern (not shown) through which the device isolation film 22 in the cell region is exposed and the first photoresist pattern is then removed.

In the above, the tunnel oxide film 23 is formed in thickness of 80 Å±4 Å and the first polysilicon layer 24 is formed in thickness of 600 Å±60 Å.

Figure 2B:
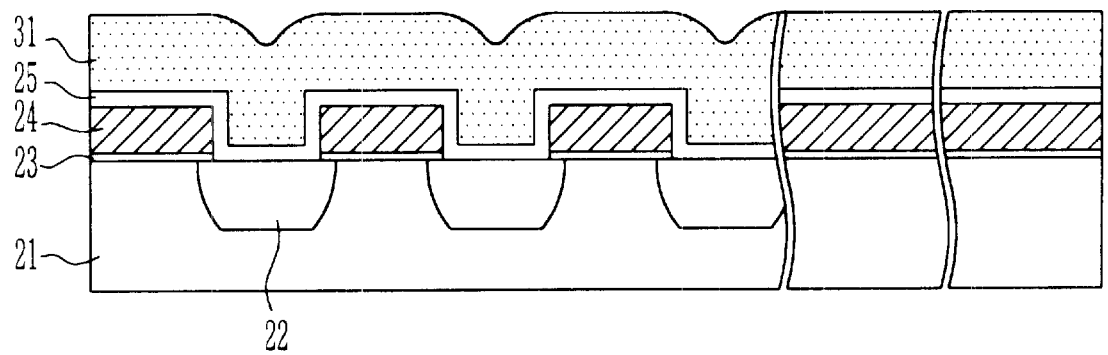

Referring now to FIG. 2B, a dielectric film 25 is formed on the entire structure including the first patterned polysilicon layer 24. An amorphous silicon layer 31 is formed on the entire structure including the dielectric film 25.

In the above, the dielectric film 25 has an ONO structure in which a lower oxide film is deposited in thickness of 40 Å±4 Å, a nitride film is deposited in thickness of 60 Å±6 Å and an upper oxide film is deposited in thickness of 40Å±4 Å. The amorphous silicon layer 31 is thickly deposited in thickness of 2000 Å±1000 Å using undoped silicon to completely fill an open portion of the first polysilicon layer 24 at the device isolation film 22 in the cell region.

Figure 2C:
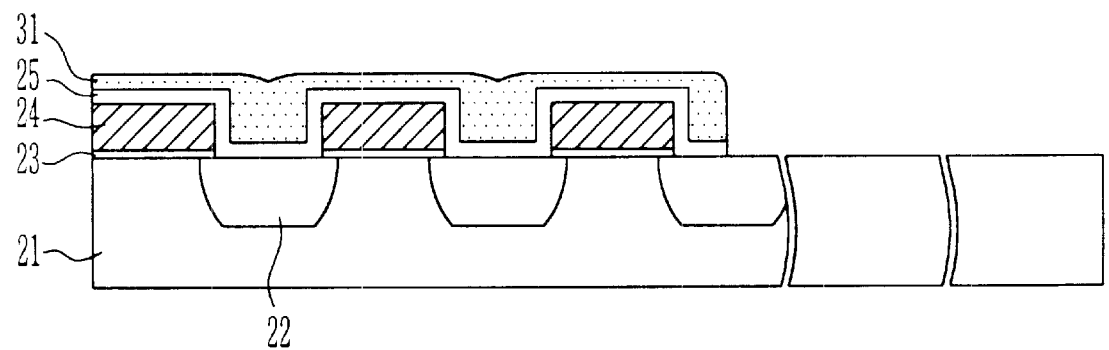

Referring now to FIG. 2C, the amorphous silicon layer 31 is removed by an etch-back process to an extent that the dielectric film 25 is exposed. Next, the amorphous silicon layer 31, the dielectric film 25 and the first polysilicon layer 24 in the peripheral circuit region are removed by an etch process using a second photoresist pattern (not shown) in which the cell region is covered and the second photoresist pattern is then removed.

In the above, the etch-back process is performed so that the amorphous silicon layer 31 remains in thickness of about 700 Å.

Figure 2D:
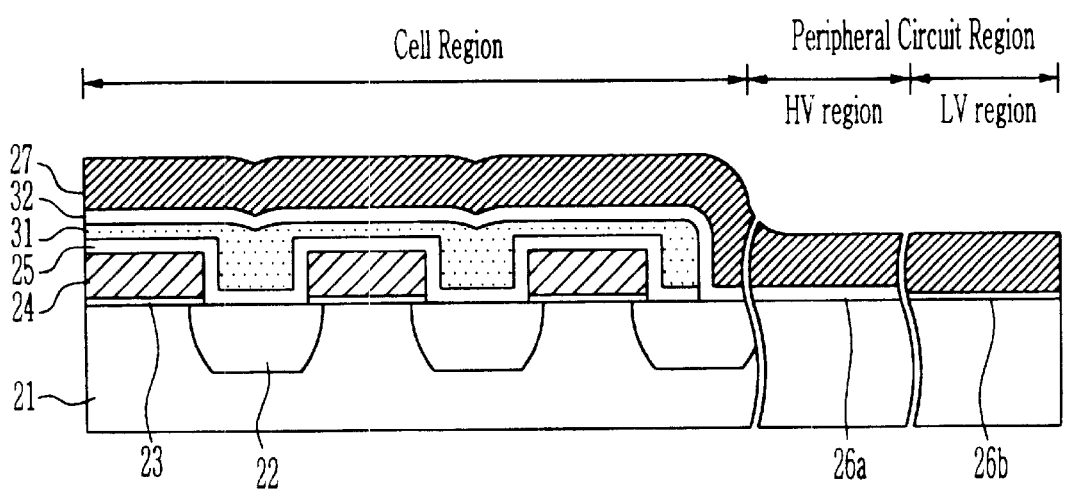

Referring now to FIG. 2D, a process of oxidizing a gate in the high voltage transistor, a process of forming a third photoresist pattern (not shown) through which the low voltage transistor region is exposed, a wet etch process of removing oxide, a process of removing the third photoresist pattern and process of oxidizing the gate in the low voltage transistor are sequentially implemented to form gate oxide films 26a and 26b in the high voltage transistor region and the low voltage transistor region, respectively. A second polysilicon layer 27 is formed on the entire structure in which an oxide film 32 and the gate oxide films 26a and 26b are formed.

In the above, the high voltage gate oxide film 26a is formed in thickness of 125 Å±6 Å and the low voltage gate oxide film 26b is formed in thickness of 55 Å±3 Å. The second polysilicon layer 27 is formed in thickness of 700 Å±70 Å wherein the second polysilicon layer 27 is formed by first depositing doped polysilicon in thickness of about 600 Å and then depositing undoped polysilicon in thickness of about 100 Å.

Figure 2E:
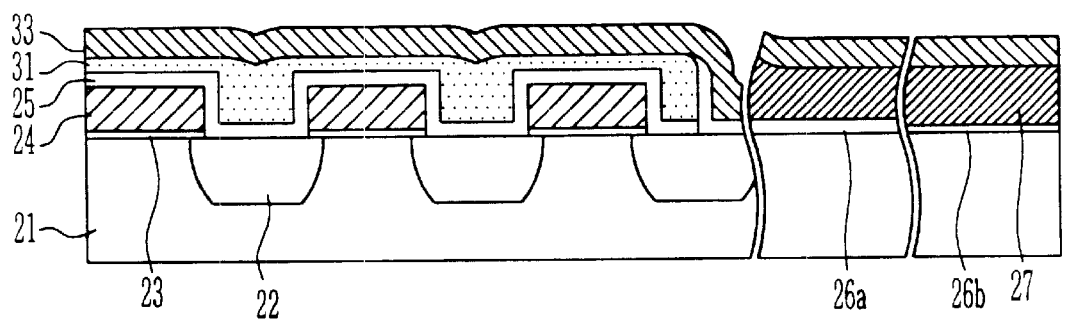

Referring now to FIG. 2E, the second polysilicon layer 27 and the oxide film 32 in the cell region are removed by an etch process using the fourth the photoresist pattern (not shown) where the cell region is open and the fourth photoresist pattern is then removed. A top polysilicon layer 33 is formed on the entire structure from which the oxide film 32 is removed.

In the above, the top polysilicon layer 33 is formed in thickness of 500 Å±50 Å, wherein doped polysilicon is first deposited in thickness of about 400 Å and undoped polysilicon is then deposited in thickness of about 100 Å thereon.

Figure 2F:
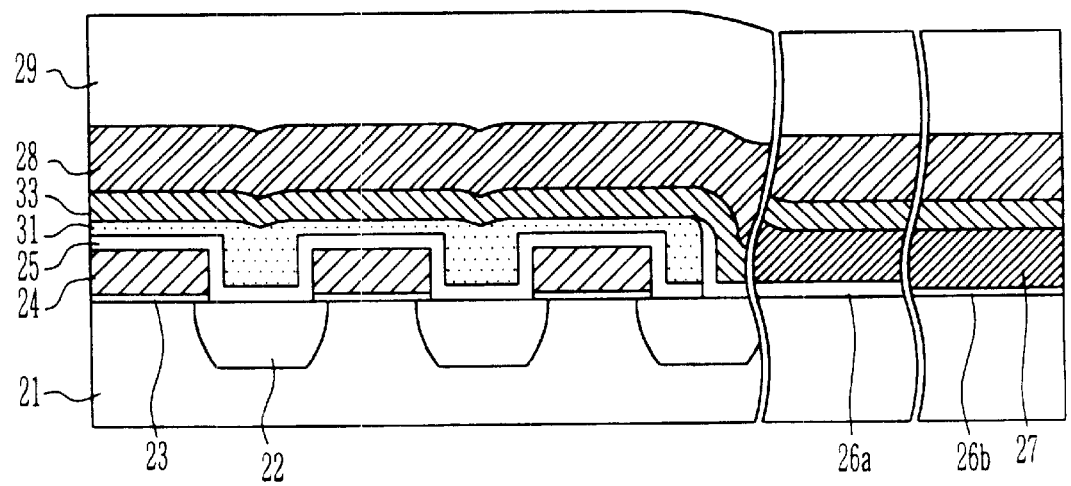

Referring now to FIG. 2F, a metal-silicide layer 28 is formed on the top polysilicon layer 33 and a hard mask layer 29 is formed on the metal-silicide layer 28. Thereafter, general processes are performed.

In the above, the metal-silicide layer 28 is formed by depositing a material such tungsten suicide in thickness of 1500 Å±150 Å. The hard mask layer 29 serves to protect the gate from processes such as subsequent etch process and the like. The hard mask layer 29 is formed by sequentially depositing a PE-TEOS film, a PE-the nitride film and an ARC nitride film. At this time, the PE-TEOS film is deposited in thickness of 300 Å±30 Å, the PE-the nitride film is deposited in thickness of 2000 Å±200 Å and the ARC nitride film is deposited in thickness of 1200 Å±120 Å.

The flash memory device explained by reference to the drawings was described by taking a stack gate flash EEPROM of 0.18 µm technology as an example. Therefore, it should be noted that the numerical limit is set based on 0.18 µm technology.

In case that the flash memory device is manufactured by the above method of the present invention, the above conventional problems can be solved.

First, after the dielectric film 25 is formed, the amorphous silicon layer 31 is formed. In case of using doped silicon, there is a possibility that defects such poly not completely removed may be generated in a subsequent gate etch process since defects such as watermark are generated in a subsequent cleaning process. Therefore, in the present invention, the amorphous silicon layer 31 is formed using undoped silicon. Also, as the amorphous silicon layer 31 is formed using undoped silicon, the probability that a pinhole will be generated after a poly etch-back process can be reduced since a poly grain size is small. As the amorphous silicon layer 31 is used, the difference in the topology in the first polysilicon layer 24 can be obviated to prevent generation of a seam. Therefore, an EDR target (Electrical Design Rule Target) can obtain a word resistance of the sheet resistance of which is 7.6Ω.

Second, in the present invention, the amorphous silicon layer 31 is etched back, which serves to reduce the step coverage with a region from which the first polysilicon layer 24 in the cell region is removed and forms a smooth topology to remove a seam after a subsequent metal-silicide layer 28 is deposited. At this time, the etch-back process is performed to an extent that the dielectric film 25 is not exposed. If the etch-back process is performed beyond that extent, the gate is experienced by a stress and a charge loss is thus caused from the dielectric film 25.

Third, as the cell region is covered with the amorphous silicon layer 31 when the gate oxide films 26a and 26b are formed in the peripheral circuit region, loss of the dielectric film 25 such as the ONO structure can be prevented even though a pre-cleaning process for improving the film quality of the gate oxide films 26a and 26b is performed. Therefore, the film quality of the gate oxide films 26a and 26b as well as the dielectric film 25 can be simultaneously improved.

Fourth, the top polysilicon layer 33 may be used as an interconnection layer for connecting the gate in the cell region and the gate in the peripheral circuit region.

Fifth, as the second polysilicon layer 27 and the top polysilicon layer 33 are formed by deposition of doped polysilicon and undoped polysilicon, generation of defects such as a watermark can be prevented.

As mentioned above, the present invention has outstanding advantages that it can improve the film quality of a dielectric film and a gate oxide film in a peripheral circuit region as well as the resistance of a word line. Therefore, the present invention can improve the speed and performance of the device.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a flash memory device method, comprising the steps of:
    forming a device isolation film in a semiconductor substrate in which a cell region and a peripheral circuit region are defined;
    sequentially forming a tunnel oxide film and a first polysilicon layer on the entire surface of said semiconductor substrate;
    removing said first polysilicon layer and said tunnel oxide film to expose said device isolation film in the cell region;
    forming a dielectric film on the entire surface including said first polysilicon layer;
    forming an amorphous silicon layer on the entire surface including said dielectric film;
    etching said amorphous silicon layer to an extent that said dielectric film is not exposed;
    removing said amorphous silicon layer, said dielectric film and said first polysilicon layer in the peripheral circuit region;
    forming a gate oxide film in the peripheral circuit region;
    forming a second polysilicon layer on the entire structure including said gate oxide film;
    removing said second polysilicon layer in the cell region to expose said amorphous silicon layer in the cell region and said second polysilicon layer in the peripheral circuit region;
    forming a top polysilicon layer on the entire structure including the exposed amorphous silicon layer and said second exposed polysilicon layer; and
    forming a metal-silicide layer on said top polysilicon layer.

2. The method of manufacturing a flash memory device method as claimed in claim 1, wherein said first polysilicon layer is formed in thickness of 600 Å±60 Å.

3. The method of manufacturing a flash memory device method as claimed in claim 1, wherein said dielectric film has an ONO structure in which a lower oxide film is deposited in thickness of 40 Å±4 Å, a nitride film is deposited in thickness of 60 Å±6 Å and an upper oxide film is deposited in thickness of 40 Å±4 Å.

4. The method of manufacturing a flash memory device method as claimed in claim 1, wherein said amorphous silicon layer is formed using undoped silicon.

5. The method of manufacturing a flash memory device method as claimed in claim 1, wherein said amorphous silicon layer is formed in thickness of 2000 Å±1000 Å.

6. The method of manufacturing a flash memory device method as claimed in claim 1, wherein said amorphous silicon layer is etched to remain in thickness of about 700 Å by etch-back process.

7. The method of manufacturing a flash memory device method as claimed in claim 1, wherein said second polysilicon layer is formed in thickness of 700 Å±70 Å, wherein doped polysilicon is first deposited in thickness of about 600 Å and undoped polysilicon is then deposited in thickness of about 100 Å thereon.

8. The method of manufacturing a flash memory device method as claimed in claim 1, wherein said top polysilicon layer is formed in thickness of 500 Å±50 Å, wherein doped polysilicon is first deposited in thickness of about 400 Å and undoped polysilicon is then deposited in thickness of about 100 Å thereon.

9. The method of manufacturing a flash memory device method as claimed in claim 1, wherein said metal-silicide layer is formed by depositing a material such as tungsten silicide in thickness of 1500 Å±150 Å.

* * * * *